United States Patent [19]
McPherson et al.
[11] 3,791,858
[45] Feb. 12, 1974

[54] METHOD OF FORMING MULTI-LAYER CIRCUIT PANELS

[75] Inventors: Alexander J. McPherson, Binghamton; Herman C. Scheer, Endicott, both of N.Y.

[73] Assignee: International Business Machines Corporation, Armonk, N.Y.

[22] Filed: Dec. 13, 1971

[21] Appl. No.: 207,500

Related U.S. Application Data

[63] Continuation of Ser. No. 812,700, April 2, 1969, abandoned.

[52] U.S. Cl. .............. 117/201, 117/104 R, 117/212, 117/217, 117/218, 156/3 X

[51] Int. Cl. .............. B44d 1/18

[58] Field of Search ........ 117/201, 212, 218, 47 B, 117/104 R, 217, 228, 229; 29/625; 156/3 X; 317/101

[56] References Cited

UNITED STATES PATENTS

| | | | |
|---|---|---|---|
| 2,728,693 | 12/1955 | Cado | 117/212 |
| 3,405,227 | 10/1968 | Hazlett | 156/3 |
| 3,388,464 | 6/1968 | Pretty | 117/212 |
| 3,391,454 | 7/1968 | Reimann et al. | 29/625 |
| 3,589,938 | 6/1971 | Blewett et al. | 117/212 |
| 3,585,074 | 6/1971 | Jones | 117/212 |
| 3,707,391 | 12/1972 | Goffe | 117/218 |

*Primary Examiner*—Alfred L. Leavitt
*Assistant Examiner*—J. Massie
*Attorney, Agent, or Firm*—Kenneth P. Johnson

[57] ABSTRACT

A process for producing multi-layer printed circuit panels using additive techniques for forming the conductors within each layer. The conductors are built up by metal deposition through photo-sensitive masks which are subsequently removed and replaced with fluid dielectric curable to a solid form. Additional layers are formed successively by repeating the process.

11 Claims, 7 Drawing Figures

METHOD OF FORMING MULTI-LAYER CIRCUIT PANELS

This is a continuation, of application Ser. No. 812,700 filed Apr. 2, 1969, now abandoned.

BACKGROUND OF THE INVENTION

In the continuing effort to further reduce the size of multi-layer printed circuit panels, the problem of interconnecting layers becomes more difficult. The former method of making circuit lands where desired and then drilling holes for inserted conductor pins is not used for the smaller circuits because of the extreme difficulty drilling the holes and reliably interconnecting the pins to the desired layers. The generally accepted method for the miniature circuits is to build up a multi-layer package by adding the interconnecting pins or "vias" and layers of circuit lines sequentially.

The construction of the vertical interconnections and the layers of circuit lines may be done by either of two processes. One process is to selectively expose photo-resist on a layer of conductive material, usually copper, then develop the resist and selectively etch the metal to leave the circuit lines or pins where desired. The remaining photo-resist is removed and the etched areas are then filled by pressing an insulative material onto the surface; thereafter insulation is removed from the top of the lines. Another layer of metal is added to the lines and the photo-resist and etching steps are repeated for the next layer of circuits or pins. Successive layers of pins or lines are added similarly.

A second process is to form circuit lines on a substrate, as by etching or screening, and then applying an insulative paste, such as a curable resin, to selected areas. Portions of the circuit lines beneath the resin are left exposed for construction of the pins. A thin layer of conductive material is coated over the entire upper surface of insulation, and exposed circuit lines and portions of the conductive material are masked. The unmasked portions are then built up by electroplating. A second circuit layer is formed by unmasking portions of the conductive material in the form of circuit lines and continuing build up. The mask is removed and the conducting material not plated is etched away. Most of the circuit lines and pins are formed by plating so that the latter method is an additive process.

The characteristics of the known subtractive processes seriously limit the degree of miniaturization obtainable. A primary drawback is the difficulty in controlling the undercutting and uniformity of the etchant for fine lines. A second disadvantage is the pressed application of sheet insulator which tends to fracture pins or circuit lines. Voids can occur near the edges of the lines and pins because the insulation does not readily flow. This adversely affects circuit impedance. In addition, metal is wasted and numerous etchant and rinse baths are required.

The additive processes overcome several of the disadvantages of subtractive techniques. The line and pin resolution is limited only by that obtainable by the exposure and development of the photo-resist. Hence finer line and pin size is possible. These processes conserve metal and also reduce the number of treatment baths. The problem of undercutting is eliminated and the number of glass exposure masters may be reduced.

The known additive processes, however, still possess the difficulty of emplacing the insulation required between layers. The screening or spraying techniques proposed for a paste require relatively large openings because of the irregular edges at the holes. When forming pins of greater than approximately 0.030 inches in diameter these techniques are adequate. However, on the smaller dimensions the circuit line or pin uniformity cannot be relied upon because of varying cross-sectional area. As the pin and line size is reduced the variations in edge irregularities become a larger and larger proportion of the cross-sectional area of the formed conductor. As a result the electrical resistance and pin strength are not uniform and are unreliable. The production yield is correspondingly low so that costs mount significantly.

It is accordingly a primary object of this invention to provide an additive process for the construction of multi-layer printed circuits which will afford a significant reduction in the size of circuit lines and pins, enabling a consequent increase in circuit density.

A further object of this invention is to provide a method for forming circuit lines and pins which reduces the number of processing steps required.

Another object of this invention is to provide a process for constructing multi-layer printed circuits in which the insulative material between circuit layers is readily flowed into all irregularities of the circuit plane without voids or undue stress on the lines and pins.

Additional objects of the invention are to provide a process for constructing circuit lines and pins which results in uniform cross-section at a wide range of sizes, enables a reduction in the required capital equipment heretofore required, and permits the emplacement of insulation after formation of the conductors in each layer.

SUMMARY OF THE INVENTION

In attaining the foregoing objects, the invention employs the additive process for circuit line and pin formation in which an electrically insulative substrate is coated with a thin layer of electrically conductive material that is, in turn, covered with a photo-sensitive resist layer. The thickness of the resist layer is at least equal to that of the minimum insulation required between circuit line planes. The photo-sensitive resist is exposed with light through a master photographic plate and developed so that the photo-resist remaining covers the conductive material except for those areas where a circuit line or pin is to be formed. Exposed areas of conductive material are built up by a deposition process until the upper surface of the developed photo-resist is reached, thus forming the conductors or pins. The developed photo-resist is then removed leaving the built-up conductors and thin conductive layer on the substrate. A brief acid etch is used to remove the exposed thin layer so that only conductors remain on the substrate surface. A fluid or powdered insulative resin or glass is flowed over the substrate to a depth at least equal to the thickness of the conductors and then cured to a solid state. At this point the cured resin or glass surface can be roughened, a thin layer of conductive material added, and the process repeated to construct the pins interconnecting with the next layer.

This process of circuit construction can achieve smaller sizes because it relies principally on the photographic resolution of the photo-sensitive resist. Accordingly, greater circuit density is made possible. The use of a fluid, or powdered curable insulative material eliminates the danger of conductor fracture or damage and prevents voids. Smaller capital investment is required because of fewer treatment baths and exposure stations. This process also permits a wide variation in the arrangement of circuit lines and pins since they can be started or terminated at any point desired.

The foregoing and other objects, features and advantages of the invention will be apparent from the following more particular description of a preferred embodiment of the invention, as illustrated in the accompanying drawings, wherein:

FIGS 1 through 6 illustrate steps in a process for constructing multi-layer circuit panels in accordance with the invention; and FIG. 7 is a sectional view of a multi-layer circuit panel as constructed by the process of FIGS. 1–6.

DESCRIPTION OF PREFERRED EMBODIMENT

Figure 1:
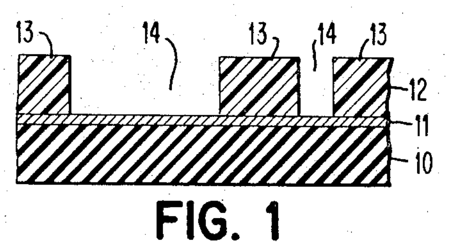

Referring to FIG. 1, a suitable insulative substrate 10 of glass cloth-epoxy resin or ceramic is "flash" coated with an electrically-conductive material 11 such as copper. A "flash" coating of metal can be formed by well-known electroless deposition methods to provide a layer a few microns thick. Steel of any variety may also be used as a substrate with a thin electrolytically deposited metal to act as a separating layer. The separating layer can be removed by a "flash" etch at the end of the process. This layer establishes a temporary electrical circuit to all potential circuit points on the substrate surface.

A photo-sensitive resist coating 12 is next applied. The photo-resist may be any of those commercially available. Application is usually made by brushing, spincoating or dipping. A preferred photo-resist, however, is "Riston" a commercial product of E. I. DuPont de Nemours Co. "Riston" is available in sheet form in various thicknesses and is laminated to the plated metal 11. Two or more thicknesses can be successively laminated to provide the required thickness. The thickness of the applied photo-resist is determined by the circuit line thickness or pin height desired.

The photo-resist is exposed to light through a mask to expose areas 13 which are to be cross-linked and left in place as a protective coating during metal deposition. Areas 14 are unexposed and, upon developing, the photo-resist is removed leaving the thin metal layer 11 uncovered in those areas which are in the configuration of circuit lines and pins to be built up. It should be noted that infrared-sensitive resists may also be used. The photo-resist process description applies to "negative" type photo-resists. When "positive" type photo-resists are used, the light breaks down the resist to give reverse patterns.

Figure 2:
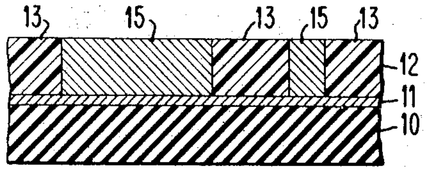

After the exposed photo-resist has been developed, conductive material 15, such as copper, is added to layer 11, as shown in FIG. 2. Metal deposition is preferably done by electroplating. Conductive layer 11 serves as one electrode during electroplating so that all areas not covered with photo-resist are built up simultaneously. The photo-resist serves also as a plating resist. Metal deposition continues until the desired level is attained, usually to the top of resist layer 12. In FIGS. 2–7, the electrolessly plated layers are shown as distinguishable from electroplated layers only for purposes of illustration. Such is not the case in actuality if like metals have been deposited.

Figure 3:
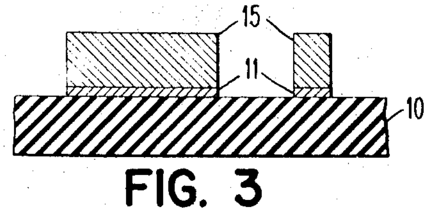

The remaining photo-resist is removed at the conclusion of electroplating. Generally, immersion in a solvent, combined with brushing will remove the exposed resist. At times it may be necessary to use ultrasonic agitation. After removing the photo-resist, the substrate is momentarily dipped in an acid etchant to remove metal layer 11 in areas 13 where the photo-resist had been during plating. The etchant also attacks the electro-deposited metal but very little metal is removed because of the relatively short time required to erode layer 11. FIG. 3 illustrates the substrate and circuits at this point.

Figure 4:
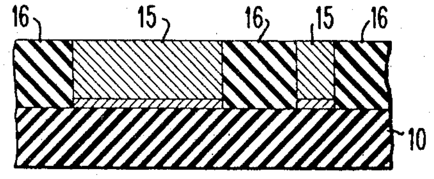

A fluid or powdered insulative material 16 is added after the "flash" metal layer has been removed and is shown in FIG. 4. The dielectric is preferably an organic thermosetting or thermoplastic resin in either the liquid, uncured state or in a powdered, semicured B-stage. Epoxy resin has been found well-suited to this procedure. The fluid state of the resin permits the dielectric to readily flow by gravity around the circuit lines without need of pressure. The dielectric is preferably brought to a level sufficient to cover the circuit elements. This helps to insure that each element is surrounded with insulation.

Another dielectric material with suitable characteristics is powdered glass of low sintering temperature, such as a borosilicate. The glass powder is applied in quantity sufficient to cover the circuit elements and then sintered at a temperature, such as 700°–850° C. to form a solid mass.

The substrate with insulative material in place is placed in an oven to cure or sinter the dielectric to a solid homogeneous layer as shown. Circuit lines and pins are exposed at the top by removing the excess dielectric. Removal can be accomplished by abrading such as sanding and polishing or by shearing such as microtoming. The methods should be effective to clean the metal surfaces sufficiently to permit good contact with the next applied metal layer. If found necessary, a brief chemical etch can be used to prepare the surfaces of the circuit elements. Glass covering the circuit elements is removed by abrading or lapping.

The dielectric surface can be treated to enhance adhesion of the next conductor layer by any conventional micro roughening method such as vapor blasting, bead-blasting, etc. Adhesion can also be increased by inclusion of micro size particles in the surface which cause better bond strength by mechanical means or improved chemical bond. Removal of micro size inclusion particles from the surface by chemical means such as leaching will increase mechanical bonding.

Figure 5:
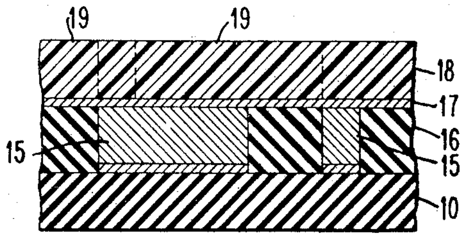

The second layer of circuit elements is added to the first by using the same sequence of steps. In FIG. 5 the "flash" layer 17 of copper has been electrolessly plated to the top of the first layer of deposited elements 15 and cured resin 16, as shown in FIG. 4. The cured resin is preferably micro-roughened to permit good adhesion of the electrolessly applied metal. A layer of photo-resist 18 has been applied thereafter and exposed at areas 19.

Figure 6:
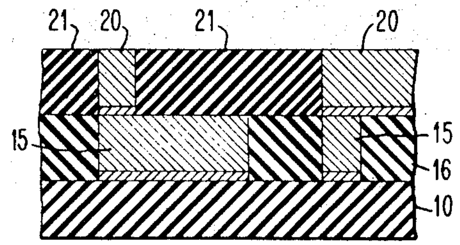

As seen in FIG. 6, circuit elements 20 are electrolytically plated up in those areas where the unexposed photo-resist is then removed during development. Exposed photo-resist is then removed and the layer 17 is briefly etched as described above. Liquid or powdered resin 21 or glass is added and cured to complete the second layer.

Figure 7:
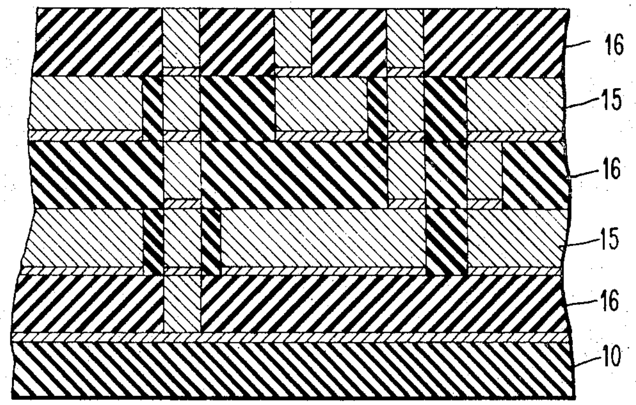

FIG. 7 illustrates several layers built up successively according to the method of the invention. Note that circuit pins or lines can be started or terminated where desired among the layers. Quality inspection and testing can be done at any layer of circuit elements, and, if found defective, the layer can be repaired or removed and replaced.

The step of using fluid or powdered dielectric is particularly advantageous because it eliminates the use of pressure heretofore required to push the semi-solid dielectric around the circuit elements. The pressure often resulted in fracture of the elements having a diameter of a few thousandths of an inch. The fluid dielectric readily flows into sharp corners and edge irregularities thus providing uniform impedance and offering improved support for the circuit panel.

While the invention has been particularly shown and described with reference to a preferred embodiment thereof, it will be understood by those skilled in the art that various changes in form and details may be made therein without departing from the spirit and scope of the invention.

What is claimed is:

1. In a method of making a multi-layer circuit panel the steps of:

coating at least one planar surface of a substrate with an electrically conductive material;

covering selected areas of said material with a protective coating;

depositing additional electrically conductive material on areas not covered by said protective coating to increase the thickness thereof to a predetermined level;

removing said protective coating and said conductive material thereunder;

flowing fluid insulative material onto said substrate where said protective coating and conductive coating have been removed by relying only on gravity to distribute said fluid insulative material to a uniform thickness, said fluid material being applied at least to a depth equal to the height of said additionally deposited conductive material;

converting said insulative material to a solid homogeneous mass;

removing said solid insulative material to a level exposing said additionally deposited conductive material; and coating said remaining solid insulating material and said exposed additionally deposited conductive material with an electrically conductive material.

2. The method as described in claim 1 wherein the combined surfaces of said solid insulating material and said additionally deposited conductive material are substantially coplanar and parallel with said substrate surface after said additionally deposited conductive material has been exposed.

3. The method as set forth in claim 1 wherein said fluid insulative material is a liquid.

4. The method according to claim 1 wherein said electrically conductive coating and additionally deposited conductive material are the same metal.

5. The method according to claim 1 wherein said electrically conductive coating and additionally deposited conductive material are different metals.

6. The method according to claim 1 wherein said insulative material is an organic resin applied to said substrate in a liquid form.

7. The method according to claim 1 wherein said insulative material is an organic resin applied to said substrate in a powdered form.

8. The method according to claim 1 wherein said insulative material is powdered glass.

9. The method according to claim 1 wherein said substrate is an electrically insulative substance.

10. The method according to claim 1 wherein said substrate is an electrically conductive substance.

11. The method according to claim 1 wherein said substrate has both electrically conductive and insulative portions.

* * * * *